United States Patent
Schönecker et al.

(10) Patent No.: US 8,246,745 B2
(45) Date of Patent: Aug. 21, 2012

(54) METHOD AND DEVICE FOR PRODUCING METAL FOILS

(75) Inventors: Axel Georg Schönecker, Alkmaar (NL); Karl Ingo Steinbach, Aachen (DE)

(73) Assignee: RGS Development B.V., Petten (NL)

( * ) Notice: Subject to any disclaimer, the term of this patent is extended or adjusted under 35 U.S.C. 154(b) by 1030 days.

(21) Appl. No.: 11/587,548

(22) PCT Filed: Apr. 26, 2005

(86) PCT No.: PCT/NL2005/000310
§ 371 (c)(1),
(2), (4) Date: Oct. 1, 2008

(87) PCT Pub. No.: WO2005/104244
PCT Pub. Date: Nov. 3, 2005

(65) Prior Publication Data
US 2009/0044925 A1    Feb. 19, 2009

(30) Foreign Application Priority Data
Apr. 26, 2004    (NL) ...................................... 1026043

(51) Int. Cl.
*C30B 19/08* (2006.01)
(52) U.S. Cl. ................. 117/56; 117/55; 117/61; 117/14; 117/15; 117/26
(58) Field of Classification Search ............. 117/14, 117/15, 26, 55, 56, 61
See application file for complete search history.

(56) References Cited

U.S. PATENT DOCUMENTS

| 4,110,133 A | * | 8/1978 | Garrett et al. .................. 117/55 |
| 4,577,588 A | | 3/1986 | Mautref et al. |
| 4,670,096 A | | 6/1987 | Schwirtlich et al. |

FOREIGN PATENT DOCUMENTS

| DE | 10047929 A1 | 4/2002 |
| EP | 0497148 A1 | 8/1992 |

OTHER PUBLICATIONS

Koch et al. "Preparation, Characterisation and Cell Processing of Bayer RGS Silicon Foils (Ribbon Growth on Substrate)", Second World Conference and Exhibition on Photovoltaic Solar Energy Conversion, Jul. 6-10, 1998, Vienna, Austria, vol. 2, pp. 1254-1259.

* cited by examiner

*Primary Examiner* — Bob M Kunemund
(74) *Attorney, Agent, or Firm* — Howard & Howard Attorneys PLLC

(57) ABSTRACT

A method and device for producing metal foils using the foil-casting principle includes the steps of filling a casting frame with liquid metal, moving a substrate through the bottom of the casting frame, with the substrate belt being at a lower temperature than the melting point of the liquid metal in the bottom of the casting frame, so that a bottom layer of the liquid metal crystallizes on the substrate and a metal foil is formed on the substrate on one side of the casting frame. The method further includes the steps of measuring at least one of a thickness and weight of the metal foil, and adjusting the contact surface area between the liquid metal and the substrate as a function of the measured value for the thickness and/or weight of the foils produced.

19 Claims, 2 Drawing Sheets

METHOD AND DEVICE FOR PRODUCING METAL FOILS

BACKGROUND OF THE INVENTION

1. Field of the Invention

The invention relates to a method for producing metal foils by the foil-casting principle, comprising the steps of:
  filling a casting frame with liquid metal;
  moving a substrate through the bottom of the casting frame, the substrate being at a lower temperature than the melting point of the liquid metal, so that a bottom layer of the liquid metal crystallizes on the substrate, and a metal foil is formed on the substrate on one side of the casting frame.

2. Description of the Related Art

DE 100 47 929 A1 describes a method in which the level of the liquid metal in the casting frame is measured with the aid of a float. If the level is too high, the pressure in the bottom of the casting frame can become so high that liquid metal escapes beneath the walls of the casting frame. As a result, lumps can form on the top surface of the foils, which has a significant adverse affect on the quality of the foils. In DE 100 47 929 A1, this problem is solved by controlling the level of the metal in the casting frame during the production process to below a maximum value. A desired thickness of the foils is achieved by optimally setting the length of the casting frame, the speed of a substrate belt and the temperature difference at the transition between the metal and the substrate belt. In this method, there is only a limited possibility of adjusting the thickness of the metal foils during the production process.

SUMMARY OF THE INVENTION

It is an object of the present invention to enable the thickness of the metal foils to be controlled more successfully during the production process than has been possible with known methods.

This object is achieved by a method as described in the introduction, which is characterized by the steps of:
  measuring at least one out of the thickness and weight of the metal foil;
  adjusting the contact surface area.

The invention involves feedback of the measured thickness or the measured weight of the metal foils. Hitherto, feedback of this nature has not been deemed appropriate, since it has been assumed that the process does not react sufficiently to a change in the processing parameters used, such as the temperature of the substrate.

As is known, the growth rate of the foils is determined by the level of heat flux at the transition from the substrate to the metal. Hitherto, however, it has been assumed that the heat flux is determined by the temperature difference between the liquid metal and the substrate and by the heat conduction and heat capacity of the liquid metal and the substrate belt. However, research has shown that the thermal resistance at the interface between the substrate and the metal is of crucial importance to the growth rate of the foils. This thermal resistance is largely determined by contact points between the metal and the substrate. Outside these contact points, the heat transfer is supplied by thermal radiation, which is lower by orders of magnitude than the heat flux through the contact points. The number and size of the contact points can be influenced by changing the pressure in the liquid metal in the bottom of the casting frame and/or the wetting of the substrate at its interface with the metal.

In one embodiment of the method according to the invention, the pressure in the bottom of the casting frame is adjusted by adjusting the level of the liquid metal in the casting frame. It is already known to adjust the level of the liquid metal in the casting frame from DE 100 47 929 A1, but in the invention this is done as a function of the measured thickness and/or weight of the foils produced.

In another embodiment, the contact surface area is adjusted by varying a surrounding pressure between the metal and the substrate. A drop in the surrounding pressure causes less gas to be included, which in turn leads to a larger contact surface area.

Further advantages and characteristics of the present invention will become clear on the basis of a description of a number of embodiments, in which reference is made to the appended drawings, in which:

DESCRIPTION OF THE PREFERRED EMBODIMENTS

Figure 1:
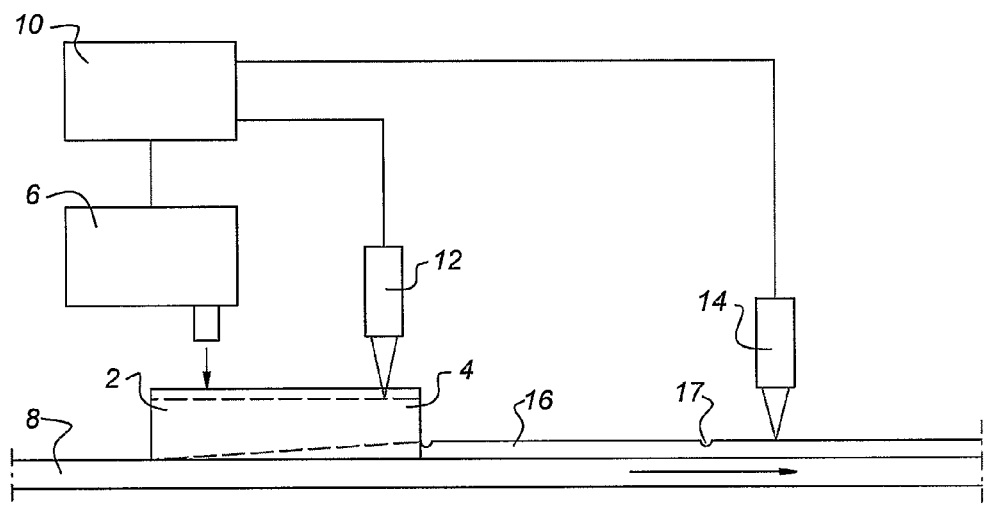
FIG. 1 shows a diagrammatic side view of a foil-casting device in accordance with one embodiment of the invention.

FIG. 1 shows a diagrammatic side view of a foil casting device in accordance with one embodiment of the present invention. The device for producing metal foils comprises a casting frame 2, into which a liquid metal can be poured. The liquid metal 4 is poured into the casting frame 2 with the aid of a feed device 6. Beneath the casting frame 2 there is a substrate belt 8 which is designed to move through the bottom of the casting frame 2 at a set speed. The drive device required for this purpose is not shown in FIG. 1. Furthermore, the foil-casting device comprises a control module 10 and a level meter 12 designed to determine the level of the liquid metal 4 in the casting frame 2. The temperature of the substrate belt 8 is set to be such that the liquid metal 4 crystallizes at the surface of the substrate belt 8. Since the substrate belt 8 is moving, to the right in FIG. 1, a foil 16 will be formed at a downstream side of the casting frame 2. This foil 16 presses the casting frame 2 upwards on the downstream side, with the result that the casting frame tilts slightly. The control module 10 receives information about the level of the liquid metal 4 in the casting frame 2 from the level meter 12. During the production process, without control the level of the liquid metal 4 will drop. However, a drop in the level is measured by the level meter 12 and transmitted to the control module 10. The control module 10 is designed to actuate the feed device 6 with the aid of the level information. The feed device 6 is designed to enable a defined quantity of liquid metal to flow into the casting frame 2. The level of the liquid metal 4 can be controlled in this way, which is known from the prior art. In DE 100 47 929 A1, this control is used to prevent the pressure in the bottom of the casting frame 2 from becoming too high, so that liquid metal can flow out at the downstream side of the casing frame 2.

In one embodiment, the foil-casting device comprises a thickness-measuring apparatus 14 which is designed to measure the thickness of the foils 16 produced. One example of a thickness-measuring apparatus is a proximity sensor 14, which uses a laser beam to measure the distance between a top surface of the foils 16 and the proximity sensor 14. Since the distance between the substrate belt 8 and the proximity sensor 14 is known, the thickness of the foils 16 can be determined from the measured distance. The thickness-measuring apparatus 14 is designed to send thickness information to the control module 10. If the metal foils 16 are too thick, the control module 10 will lower the pressure in the casting frame by supplying less liquid metal with the aid of the feed device 6. As a result, over the course of time the pressure in the bottom of the casting frame 2 will drop, thereby reducing a contact surface area between the metal and the substrate belt 8. As a result, there will be less heat transfer between the metal and the substrate belt 8, with the result that the growth rate of the foil 16 decreases. As a result, the thickness of the foil 16 will also decrease. The idea behind this control is derived from the insight that the contact surface area between the metal and the substrate belt 8 can be varied by varying the pressure in the bottom of the casting frame 2. This insight will now be explained in more detail with the aid of FIG. 2.

Figure 2:
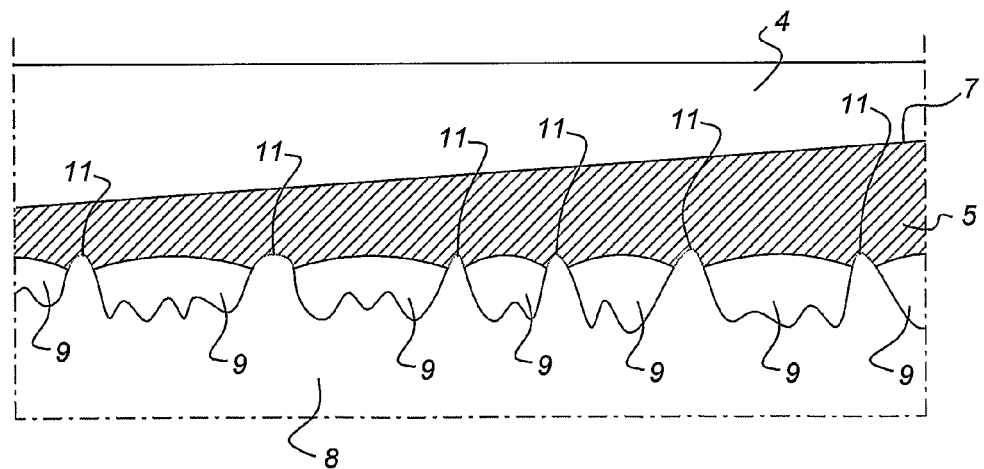
FIG. 2 shows a microscopic cross section through the contact surface between the metal and the substrate belt.

FIG. 2 shows a microscopic cross section through the contact surface between the metal and the substrate belt 8. The scale of the direction perpendicular to the substrate belt 8 has been stretched out for the sake of clarity. The liquid metal 4 will crystallize as a result of cooling, so as to form a crystallized layer 5. On account of the substrate belt 8 moving, a contact surface 7 between the liquid metal 4 and the crystallized metal 5 has an inclination, cf. FIG. 2. The substrate belt 8 has a defined roughness at the surface. This is indicated on an enlarged scale in FIG. 2 by a number of bumps. Research has shown that cavities 9 are formed during the crystallization process. There is no metal in these cavities 9. The cavities 9 may, for example, be filled with a gas which is present above the substrate belt 8 close to the casting frame 2. In FIG. 2, contact points between the crystallized metal 5 and the substrate belt 8 are indicated by reference numerals 11. The combined size of these contact points 11 is the predominant factor in determining the heat transfer between the liquid metal 4 and the substrate belt 8. Only a limited quantity of heat is dissipated via the cavities 9. The size of the contact points 11 can be influenced by varying the pressure prevailing in the bottom of the casting frame 2. A greater pressure will provide more and/or larger contact points. This insight is exploited in the invention to use the level of the liquid metal 4 in the casting frame 2 as a control parameter during the production process for controlling the thickness of the metal foils.

The pressure in the bottom of the casting frame 2 can also be adjusted by controlling a pressure difference between an atmosphere in the casting frame 2 and an atmosphere outside the casting frame 2. In this variant embodiment, the casting frame 2 is designed in such a way as to be closed off from the environment, for example by a cover. Liquid metal can be fed into the casting frame 2 by designing the feed device 6 in such a way that it supplies liquid metal at a pressure which is higher than the pressure created in the casting frame 2. Of course, the pressure created must not be so high that liquid metal flows out under the casting frame 2. An optional pressure gauge in the casting frame 2 can be used to monitor a defined pressure, so that this pressure can be successfully controlled, for example via the control module 10.

Figure 3:
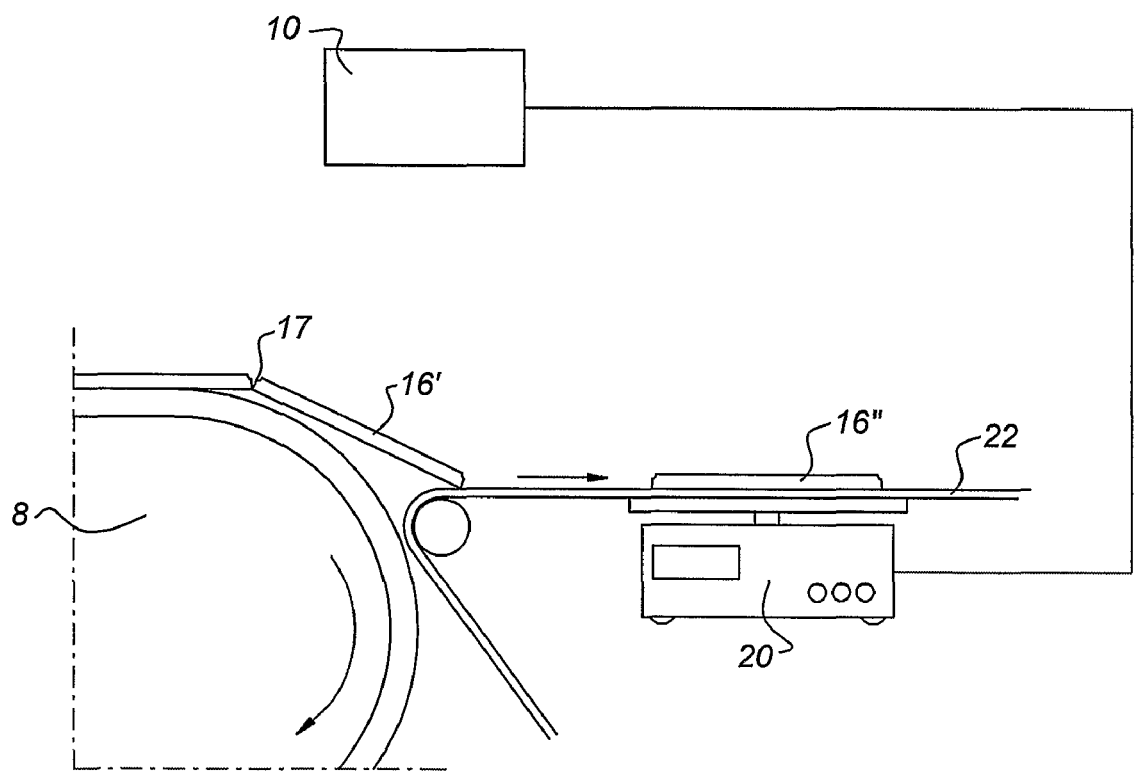
FIG. 3 shows a part of a foil-casting device in accordance with another embodiment of the invention.

FIG. 3 shows part of a foil-casting device according to another embodiment. The device comprises a substrate belt 8 which curves away downwards, so that the metal foil 16 comes off the substrate belt 8. It is preferable for the substrate belt 8 to be designed in such a way that notches 17, which serves as breaking fines, are formed in the metal foil 16. One possible way of designing the substrate belt 8 for this purpose is to arrange slots in the top side of the substrate belt 8, as described in patent publication EP 0 497 148. FIG. 3 shows a metal foil 16' which is released under the force of gravity. Next to the substrate belt 8 there is a moving belt 22, beneath which there is a weighing device 20 designed to weigh a metal foil 16". If the weighing device 20 detects the metal foil 16", the measuring device 20 will weigh the metal foil 16" and transit information about the weight of the metal foil 16" to the control module 10. The dimensions of the metal foils 16, 16' and 16" are determined by the dimensions of the substrate belt 8 and the distance between slots (not shown) which are present on the substrate belt 8. These slots cause the above-mentioned breaking lines in the metal foil 16.

The pressure in the bottom of the casting frame 2 can also be adjusted by realizing a flow in the liquid metal 4. A flow of this type can be realized, for example, by making the substrate belt 8 move at a sufficiently high speed. The liquid metal is carried along with it in the direction of movement and then rises at the exit side of the casting frame 4, i.e. the side where the substrate belt 8 leaves the casting frame 4. The liquid metal then flows back into the casting frame 4 via the surface and then drops at the entry side of the casting frame 4, i.e. the side where the substrate belt 8 approaches the casting frame 4. As a result of this drop, the pressure in the bottom of the casting frame 4 at the entry side is increased. The increase in the pressure can be controlled by setting a defined speed of the substrate belt 8.

In an embodiment of the method according to the invention, the contact surface area between the liquid metal and the substrate is adjusted by adjusting the pressure in the bottom of the casting frame. It is in this way possible to obtain a desired thickness and/or weight of the foil. The contact surface area can also be adjusted by, for example, controlling the wetting of the substrate belt 8 with the liquid metal 4. In one embodiment, this wetting is controlled by adapting one or more of the following parameters:

the gas composition of the gas surroundings,
the surrounding gas pressure,
the temperature of the liquid metal,
the temperature of the substrate.

The choice of material used for the substrate and the liquid metal also determines the wetting. All these parameters can be varied in order to obtain a desired thickness and/or weight of the foil 16 produced. The pressure and composition of the gas surrounding the contact surface between the liquid metal 4 and the substrate belt 8 influences the wetting.

The wetting can also be adapted by varying the supply of oxygen to the liquid metal. The supply of oxygen causes surface oxidation of both metal and substrate material, with the result that the surface tension is determined by the oxidized form of the materials.

The surface roughness of the substrate belt 8 is preferably in the range from 1-10 μm.

The sure roughness has a considerable influence on the number and size of the contact points. However, the surface roughness can only be preset and cannot be varied during the production process.

In another embodiment, the contact surface area is adjusted by varying a surrounding pressure between the volume in the casting frame and the surroundings. This can be achieved by closing the casting frame and the filling unit in a gastight manner with respect to the surroundings of the casting frame. A drop in surrounding pressure results in less gas being included, which in turn leads to a larger contact surface area. A larger contact surface area results in greater heat transfer, which in turn is responsible for a faster growth rate. As has already been explained above, this leads to a thicker foil.

One embodiment of the invention is a method for producing silicon foils. These foils can be used, inter alia, to make solar cells. A method of this type produces relatively inexpensive solar cells. Moreover, these foils are rectangular in form, which allows the solar cells to make maximum use of the surface area on which they are placed.

It will be understood that variants will occur to those skilled in the art on reading the above text. As an alternative to a floating casting frame, it is also possible for a casting frame to be fixed in terms of its height, or the volume of molten metal can be fixed by means of rollers or an air blade. Variants of this type are deemed to lie within the scope of the invention as described in the appended claims.

The invention claimed is:

1. A method for producing metal foils by the foil-casting principle, the method comprising the steps of:
   filling a casting frame with liquid metal;
   moving a substrate through a bottom of the casting frame, wherein the substrate is at a lower temperature than the melting point of the liquid metal in the bottom of the casting frame, such that a bottom layer of the liquid metal crystallizes on the substrate, and a metal foil is formed on the substrate on one side of the casting frame;
   measuring at least one of a thickness and a weight of the metal foil;
   adjusting a contact surface area between the liquid metal and the substrate as a function of a measured value for the at least one of the thickness and the weight.

2. The method according to claim 1, wherein the contact surface area is adjusted by setting the pressure in the liquid metal in the bottom of the casting frame.

3. The method according to claim 2, wherein the pressure in the bottom of the casting frame is adjusted by adjusting the level of the liquid metal in the casting frame.

4. The method according to claim 2, wherein the pressure in the bottom of the casting frame is adjusted by controlling a pressure difference between an atmosphere in the casting frame and an atmosphere outside the casting frame.

5. The method according to claim 2, wherein the pressure in the bottom of the casting frame is adjusted by realizing a flow in the liquid metal.

6. The method according to claim 1, wherein the surface roughness of the substrate is in the range of 1-10 micrometers.

7. The method according to claim 3, wherein the surface roughness of the substrate is in the range of 1-10 micrometers.

8. The method according to claim 4, wherein the surface roughness of the substrate is in the range of 1-10 micrometers.

9. The method according to claim 1, wherein the liquid metal is silicon.

10. The method according to claim 4, wherein the liquid metal is silicon.

11. The method according to claim 6, wherein the liquid metal is silicon.

12. The method according to claim 1, wherein the level of the liquid metal in the casting frame is measured.

13. The method according to claim 6, wherein the level of the liquid metal in the casting frame is measured.

14. The method according to claim 7, wherein the level of the liquid metal in the casting frame is measured.

15. The method according to claim 1, wherein the contact surface area is adjusted by varying a surrounding pressure between the liquid metal and the substrate.

16. The method according to claim 1, wherein the contact surface area is adjusted by changing the wetting between the liquid metal and the substrate, wherein the change in the wetting is realized by changing at least one of a temperature of the substrate, a temperature of the liquid metal, a pressure of a surrounding gas and a composition of the surrounding gas.

17. The method according to claim 3, wherein the contact surface area is adjusted by changing the wetting between the liquid metal and the substrate, wherein the change in the wetting is realized by changing at least one of a temperature of the substrate, a temperature of the liquid metal, a pressure of a surrounding gas and a composition of the surrounding gas.

18. The method according to claim 4, wherein the contact surface area is adjusted by changing the wetting between the liquid metal and the substrate, wherein the change in the wetting is realized by changing at least one of a temperature of the substrate, a temperature of the liquid metal, a pressure of a surrounding gas and a composition of the surrounding gas.

19. A foil-casting device for producing metal foils using the foil-casting principle, comprising:
   a casting frame and a substrate, wherein the casting frame is adapted to receive the substrate through a bottom of the casting frame, wherein the substrate is at a lower temperature than the melting point of a liquid metal in the bottom of the casting frame, such that a bottom layer of the liquid metal crystallizes on the substrate and a metal foil is formed on the substrate on one side of the casting frame;
   a measuring device configured to measure at least one of a thickness and a weight of the metal foil; and
   a control module configured to receive measurement data from the measuring device in order to adjust a contact surface area between the liquid metal and the substrate as a function of a measured value for the at least one of the thickness and the weight.

* * * * *